United States Patent [19]

Green et al.

[11] 4,383,025
[45] May 10, 1983

[54] PHOTOPOLYMERIZATION BY MEANS OF SULFOXONIUM SALTS

[75] Inventors: George E. Green, Stapleford; Edward Irving, Burwell, both of England

[73] Assignee: Ciba-Geigy Corporation, Ardsley, N.Y.

[21] Appl. No.: 278,243

[22] Filed: Jun. 29, 1981

[30] Foreign Application Priority Data

Jul. 10, 1980 [GB] United Kingdom ................ 8022550
Apr. 15, 1981 [GB] United Kingdom ............... 81111902

[51] Int. Cl.³ ............................................. G03C 1/68
[52] U.S. Cl. ............................. 430/280; 204/159.11; 204/159.14; 204/159.18; 204/159.22; 204/159.23; 204/159.24; 430/281; 430/921; 430/923; 430/914; 260/440; 260/446; 260/447; 526/220; 526/225; 528/90; 528/143; 528/378; 564/101; 564/192; 564/153; 564/169
[58] Field of Search ..................... 204/159.24, 159.22, 204/159.23, 159.14, 159.18; 430/281, 280, 921, 923, 714; 260/440, 446, 447; 564/101, 192, 153, 200, 169

[56] References Cited

U.S. PATENT DOCUMENTS

| | | |
|---|---|---|
| 3,196,184 | 7/1965 | Berry . |
| 3,442,901 | 5/1969 | Koenig et al. . |
| 3,708,296 | 1/1973 | Schlesinger . |
| 3,989,644 | 11/1976 | Bolon et al. . |
| 4,032,673 | 6/1977 | Schroeter et al. . |
| 4,058,400 | 11/1977 | Crivello . |
| 4,058,401 | 11/1977 | Crivello . |
| 4,069,054 | 1/1978 | Smith . |
| 4,081,276 | 3/1978 | Crivello . |
| 4,085,019 | 4/1978 | Green . |
| 4,090,936 | 5/1978 | Barton . |
| 4,101,513 | 7/1978 | Fox et al. . |
| 4,102,687 | 7/1978 | Crivello . |
| 4,105,806 | 8/1978 | Watt . |
| 4,108,747 | 8/1978 | Crivello . |
| 4,113,895 | 9/1978 | Watt et al. . |
| 4,136,102 | 1/1979 | Crivello . |
| 4,138,255 | 2/1979 | Crivello . |
| 4,139,385 | 2/1979 | Crivello . |
| 4,154,872 | 5/1979 | Tsao et al. . |
| 4,156,035 | 5/1979 | Tsao et al. . |
| 4,156,046 | 5/1979 | Lien et al. . |
| 4,161,405 | 7/1979 | Crivello . |
| 4,161,478 | 7/1979 | Crivello . |
| 4,173,476 | 11/1979 | Smith et al. . |
| 4,186,108 | 1/1980 | Carlson et al. . |
| 4,193,799 | 3/1980 | Crivello . |
| 4,197,174 | 4/1980 | Chang . |
| 4,201,640 | 5/1980 | Watt . |
| 4,210,703 | 7/1980 | Scantlin et al. . |
| 4,216,288 | 8/1980 | Crivello . |
| 4,218,531 | 8/1980 | Carlson . |
| 4,219,377 | 8/1980 | Albrecht . |
| 4,230,814 | 10/1980 | Crivello . |
| 4,231,886 | 11/1980 | Carlson . |
| 4,233,421 | 11/1980 | Worm . |
| 4,241,204 | 12/1980 | Crivello . |
| 4,250,006 | 2/1981 | Guarney et al. . |
| 4,250,053 | 2/1981 | Smith . |

FOREIGN PATENT DOCUMENTS

1526923 10/1978 United Kingdom .
1565671 4/1980 United Kingdom .

OTHER PUBLICATIONS

E. J. Corey et al., J. Am. Chem. Soc., 84, 867 (1962).
O. Tsuge et al., Tetrahedron 29, 1983 (1973).

*Primary Examiner*—Jack P. Brammer
*Attorney, Agent, or Firm*—Luther A. R. Hall

[57] ABSTRACT

Substances (I) capable of being converted into higher-molecular weight materials under the influence of a cationic catalyst, such as 1,2-epoxides, aminoplasts, vinyl monomers and prepolymers, or phenoplasts, are so converted by exposure to actinic radiation in the presence of an aryl- or aroyl- carbamoylsulfoxonium salt (II) of formula

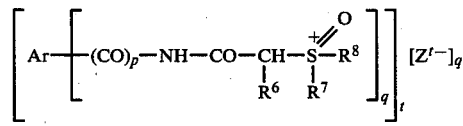

where
p is zero or 1,
q is 1 to 4,
Ar denotes an aromatic group,
R⁶ denotes —H or group —COR⁹ or —CONH-(CO)$_r$R¹⁰,
R⁷ denotes an alkyl, alkenyl, cycloalkyl, cycloalkylalkyl, aryl, or aralkyl group,
R⁸ has the same meaning as R⁷ but may alternatively represent a dialkylamino group or, if R⁷ denotes alkyl, it may alternatively represent an arylamino group,
R⁹ and R¹⁰ each denote a saturated or ethylenically unsaturated radical,
r is zero or 1,
t is 1, 2, or 3, and
Z$^{t-}$ denotes a t-valent anion of a protic acid.

Typical salts (II) are acetanilinodimethylsufoxonium hexafluorophosphate, benzoylcarbamoyldimethylsulfoxonium hexafluorophosphate, 3,4-dichloracetanilinodimethylsulfoxonium hexafluoroarsenate, 2,4-bis(dimethylsulfoxoniummethylcarbamoyl)-toluene dihexafluorophosphate, 4-methylacetanilinodimethylsulfoxonium chloride, and tris(acetanilinodimethylsulfoxonium) orthophosphate.

When I is a polyepoxide or a resol, it may be photopolymerized by means of II and subsequently crosslinked by heating with a latent heat-curing agent.

12 Claims, No Drawings

PHOTOPOLYMERIZATION BY MEANS OF SULFOXONIUM SALTS

This invention relates to compositions comprising a cationically-polymerisable material and a sulphoxonium salt. It also relates to the polymerisation of such compositions by means of actinic radiation, to the optional further crosslinking of polymerised products so obtained by means of heat in the presence of heat-curing agents, and to the use of the compositions as surface coatings, in printing plates, in printed circuits, and in reinforced composites, and as adhesives.

For a number of reasons, it has become desirable to induce polymerisation of organic materials by means of actinic radiation. Employing photopolymerisation procedures may, for example, avoid the use or organic solvents with their attendant risks of toxicity, flammability, and pollution, and the cost of recovering the solvent. Photopolymerisation enables insolubilisation of the resin composition to be restricted to defined areas, i.e., those which have been irradiated, and so permits the production of printed circuits and printing plates or allows the bonding of substrates to be confined to required zones. Further, in production processes, irradiation procedures are often more rapid than those involving heating and a consequential cooling step.

It has been known for some years that certain aromatic diazonium salts undergo decomposition on exposure to actinic radiation and that, if the salt is mixed with a cationically-polymerisable substance, then the Lewis Acid which is generated in situ on irradiation induces polymerisation (see, for example, British patent specification No. 1,321,263). Although the use of actinic irradiation overcomes disadvantages associated with the employment of heat in polymerisation processes, the diazonium salts are not entirely satisfactory: the pot-life of the mixture of diazonium salt and cationically-polymerisable substance is often too short, particularly in daylight, and secondly, nitrogen is generated during liberation of the Lewis Acid catalyst, which evolution of gas restricts the range of processes in which the catalysts may successfully be employed.

Numerous proposals have therefore been made for the replacement of these diazonium salts by others which, while liberating an acid catalyst on irradiation, do not also evolve nitrogen: particularly intensively studied have been onium salts of sulphur, and iodonium salts.

Thus, it has recently been disclosed, in British patent specification No. 1,516,511 and its U.S. equivalent, U.S. Pat. No. 4,058,401, that a mono-1,2-epoxide, an epoxide resin (i.e., a substance containing on average more than one 1,2-epoxide group), or a mixture thereof, may be polymerised or cured by means of a radiation-sensitive aromatic onium salt of oxygen, sulphur, selenium, or tellurium present in an amount capable of effecting the polymerisation or cure of the epoxide (or polyepoxide) by release of a Brønsted Acid catalyst when exposed to radiant energy. The only such salts described in the Specification are of the formula

   I where
R denotes a monovalent aromatic radical,
R¹ denotes an alkyl, cycloalkyl, or substituted alkyl group,
R² denotes a polyvalent aliphatic or aromatic radical forming a heterocyclic or fused ring structure,
X denotes oxygen, sulphur, selenium, or tellurium,
M denotes an atom or a metal or metalloid, such as antimony, iron, tin, bismuth, aluminium, gallium, indium, titanium, zirconium, scandium, vanadium, chromium, manganese, boron, phosphorus, or arsenic,
Q denotes a halogen radical,
a denotes 0, 1, 2, or 3,
b denotes 0, 1, or 2,
c denotes 0 or 1, the sum of a+b+c being 3 or the valency of X,
d denotes (e−f),
f is the valency of M, and is an integer of from 2 to 7, and
e is more than f and is an integer of up to 8.

Shortly afterwards, in British patent specification No. 1,518,141, and also in its corresponding U.S. Pat. No. 4,058,400, the same patentee disclosed that monomeric or prepolymeric, cationically polymerisable organic materials free from any 1,2-epoxide group, selected from vinyl monomers, vinyl prepolymers, cyclic ethers, cyclic esters, cyclic sulphides, cyclic amines, and organosilicon cyclics, can also be polymerised by exposing them to radiant energy in the presence of an effective amount of a radiation-sensitive onium salt of the Group VIA elements listed above. The only onium salts described are likewise of formula 1 above.

Still more recently, in its U.S. Pat. No. 4,102,687, the same patentee disclosed that the curing of urea-formaldehyde resins, melamine-formaldehyde resins, and phenol-formaldehyde resins could be initiated by exposing them to ultraviolet radiation in the presence of a Group VIA onium salt, curing being completed by heating. Again, only the onium salts of formula I are mentioned.

Subsequent disclosures of this patentee concerning onium salts of sulphur have been confined to sulphonium salts.

Thus, British patent specification No. 1,535,492 describes the use of radiation-sensitive sulphonium salts of arylsulphonic, haloarylsulphonic, alkylsulphonic, and haloalkylsulphonic acids for the cationic polymerisation of epoxide resins, vinyl monomers and prepolymers, cyclic organic ethers, cyclic organic esters, cyclic organic sulphides, cyclic amines, and cyclic organic silicon compounds.

Its U.S. Pat. No. 4,139,385 discloses the use of sulphonium and other salts in the curing of polyolefins by means of polythiols. A polyethylenically unsaturated compound, such as diallyl phthalate, diallyl maleate, or triallyl cyanurate, is mixed with a polythiol, such as trimethylolpropane trithioglycollate or pentaerythritol tetra(3-mercaptopropionate) and, e.g., triphenylsulphonium hexafluoroarsenate or triphenylsulphonium tetrafluoroborate, and then exposed to ultraviolet light. The salts used as catalysts are all of the formula

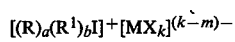   II or

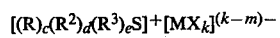   III or

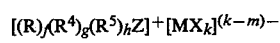   IV where
- R denotes a monovalent aromatic radical,
- $R^1$ denotes a divalent aromatic radical,
- $R^2$ denotes a polyvalent aliphatic or aromatic radical forming a heterocyclic or fused ring structure,
- $R^4$ denotes an alkyl, alkoxy, cycloalkyl, or substituted alkyl radical,
- $R^5$ denotes a polyvalent radical forming an aromatic, heterocyclic or fused ring structure,
- M denotes an atom of a metal or a metalloid,
- X denotes a halogen radical,
- Z denotes a nitrogen, phosphorus, arsenic, bismuth, or antimony atom,
- a denotes 0 or 2,
- b denotes 0 or 1, where $a+b=2$ or the valency of iodine,
- c denotes 0 or 3,
- d denotes 0 or 2,
- e denotes 0 or 1, such that $(c+d+e)=3$ or the valency of sulphur,
- f is an integer of from 0 to 4,
- g is 0, 1, or 2,
- h is 0, 1, or 2, such that $(f+g+h)=4$ or the valency of Z,
- j is $k-m$,
- m is the valency of M, being 2 to 7, and
- k is an integer of more than 1 but not more than 8.

Its West German Offenlegungsschrift No. 2 833 648 discloses that triarylsulphonium salts of the formula

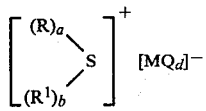

$\quad$ V can be used to initiate the curing, on irradiation, of an aliphatically-unsaturated composition containing a 1,2-epoxide group, such as glycidyl acrylate, or a mixture of an epoxide resin with an aliphatically-unsaturated substance such as methyl methacrylate, a polyester, or styrene. In formula V—
- R denotes an aromatic hydrocarbon or heterocyclic group of 6 to 13 carbon atoms, which may be substituted,
- a is 1 or 3,
- b is 0 or 1,
- S has a valency of 3, which may be satisfied by R alone or by a combination of R and $R^1$,
- M denotes an atom of a metal or metalloid,
- Q denotes a halogen radical, and
- d is 4, 5, or 6.

Its U.S. Pat. No. 4,136,102 describes various sulphonium salts containing a hexafluorophosphate, hexafluoroarsenate, or hexafluoroantimonate anion and their use in curing expoxide resins. They are stated to be also useful for the polymerisation of a variety of unspecified cyclic organic and cyclic organo-silicon compounds.

Its West German Offenlegungsschrift No. 2 730 725 discloses the photo-induced curing, by means of aromatic onium salts, of epoxide resin compositions which also contain a polyvinyl acetal. The only onium salts of sulphur indicated are those of formula I.

Its U.S. Pat. No. 4,081,276 describes a process for the formation of photoresist images, especially for printed circuit production, wherein a layer of a photoinitiator is exposed to radiant energy and then contacted with a cationically polymerisable material, e.g., an epoxide resin. Again, the only onium salts of sulphur cited are those of formula I above.

Another patentee had described, in Belgian Pat. No. 845 746, the photopolymerisation, using as catalyst an aromatic sulphonium salt or an aromatic iodonium salt, of mixtures comprising a compound having an epoxide functionality of more than 1.5 epoxide group per molecule and a compound having hydroxy functionality of at least one.

This second patentee describes, in U.S. Pat. No. 4,090,936, photohardenable liquid compositions comprising
(a) an organic compound having an average epoxide functionality in the range of about 1 to 1.3,
(b) from about 3 to 50% by weight, calculated on the weight of (a), of an organic polymer which is compatible with (a) and has a glass transition temperature in the range of about $-20°$ C. to $105°$ C., being a polymer derived from at least one acrylate or methacrylate monomer, or a copolymer of styrene and allyl alcohol, or a polyvinyl butyral polymer, and
(c) an aromatic complex salt photoinitiator which is an onium salt of a Group VA or Group VIA element or a halonium salt. The only onium salts of sulphur indicated are sulphonium salts.

Another disclosure of this second patentee, U.S. Pat. No. 4,069,054, relates to photopolymerisable compositions containing a cationically polymerisable monomer, an aromatic sulphonium compound, and an aromatic tertiary amine, aromatic tertiary diamine, or an aromatic polycyclic as a sensitiser.

An aromatic sulphonium salt, namely triphenylsulphonium hexafluorophosphate, has been used commercially for the photopolymerisation of epoxide resins.

We have now surprisingly found that cationically polymerisable materials can be photopolymerised by means of certain arylcarbamoyl-or aroylcarbamoyl-sulphoxonium salts.

The carbamoylsulphoxonium salts used in the compositions of this invention have little or no effect on heating with the more commonly used epoxide resins, i.e., polyglycidyl ethers. Thus, a composition comprising 2 parts by weight of acetanilinodimethylsulphoxonium hexafluorophosphate and 100 parts by weight of a commercially-available epoxide resin (2,2-bis(4-glycidyloxyphenyl)propane) did not gel on heating at 150° C. for 40 hours. It follows that, protected from actinic radiation, compositions of the present invention have desirably long pot-lives.

Unlike sulphonium salts of the prior art, the carbamoylsulphoxonium salts of the compositions of this invention do not liberate obnoxiously-smelling mercaptans on irradiation.

We have further found that, contrary to what would be expected from the teachings of U.S. Pat. No. 4,102,687, ureaformaldehyde resins may be cured on irradiation in the presence of a carbamoylsulphoxonium salt employed in the compositions of this invention without the need to apply heat.

This invention accordingly provides compositions comprising
(a) a compound, or mixture of compounds, capable of being transformed into a higher-molecular weight material under the influence of a cationic catalyst,
(b) an effective amount of a carbamoylsulphoxonium salt of the formula $$\left[ Ar \underset{t}{\underbrace{\left[ -(CO)_p-NH-CO-CH-\overset{+}{\underset{R^7}{\underset{|}{S}}}-R^8 \atop \underset{R^6}{|} \right]_q}} \right] [Z^{t-}]_q \qquad VI$$

where p is zero or 1, q is an integer of from 1 to 4,

Ar denotes an aromatic group of valency q, having from 4 to 25 carbon atoms and being directly linked through a carbon atom thereof to the carbon atom of the indicated adjacent carbonyl group if p is 1 or to the indicated nitrogen atom if p is zero, $R^6$ denotes a hydrogen atom or a group of formula $$-COR^9 \qquad VII$$

or $$-CO-NH-(CO)_r-R^{10} \qquad VIII$$

$R^7$ denotes an alkyl group of 1 to 18, preferably 1 to 12, carbon atoms, an alkenyl group of 2 to 6 carbon atoms, a cycloalkyl group of 3 to 8 carbon atoms, a cycloalkylalkyl group of 4 to 10 carbon atoms, an aryl group of 4 to 24 carbon atoms, or an aralkyl group of 5 to 16 carbon atoms, $R^8$ has the same meaning as $R^7$ but may alternatively represent a dialkylamino group of 2 to 6 carbon atoms or, if $R^7$ denotes a said alkyl group, it may alternatively represent an arylamino group of 4 to 8 carbon atoms, $R^9$ denotes a monovalent saturated or ethylenically unsaturated radical of 1 to 12 carbon atoms, directly linked through a carbon atom thereof to the —CO— group shown in formula VII, r is zero or 1, $R^{10}$ denotes a monovalent saturated or ethylenically unsaturated radical of 1 to 12 carbon atoms, directly linked through a carbon atom thereof to, if r denotes zero, the indicated nitrogen atom, or, if r denotes 1, the carbon atom of the indicated adjacent carbonyl group, t represents 1, 2, or 3, and $Z^{t-}$ denotes a t-valent anion of a protic acid, preferably an inorganic acid.

Another aspect of this invention provides a process for the transformation into higher-molecular weight material of a compound, or mixture of compounds, capable of being converted into a higher-molecular weight material under the influence of a cationic catalyst, comprising subjecting a said composition of this invention to actinic radiation.

In formula VI, Ar may denote a homocyclic or heterocyclic aromatic group, $R^7$ and $R^8$ may denote a homocyclic or heterocyclic aryl or aralkyl group, and $R^8$ may alternatively represent a homocyclic or heterocyclic arylamino group; by "heterocyclic aromatic", "heterocyclic aryl", or "heterocyclic aralkyl" is meant an aromatic group in which at least one —CH$_2$— or —CH═ group of a ring of an aromatic compound is replaced by an atom other than carbon, usually nitrogen, oxygen, or sulphur. Examples of heterocyclic aryl groups are 2-furyl radicals and 2-pyridyl radicals, and examples of heterocyclic arylene groups are furan-2,4-diyl and pyridine-2,6-diyl radicals. Examples of heterocyclic aralkyl groups are 2-furylmethyl and 2-pyridylmethyl radicals, and examples of heterocyclic aralkylene groups are furan-2,4-dimethylene and pyridine-2,6-dimethylene radicals.

Thus, Ar may denote a homocyclic group, for example, a tricyclic group such as an anthryl, phenanthryl, or fluorenyl group, or an anthrylene, phenanthrylene, or fluorenylene group, but preferably it represents (i) a monocyclic or dicyclic aryl or aralkyl group of 6 to 16 carbon atoms, particularly a phenyl, a 2-phenylethyl, a benzyl, or a naphthyl group, or a group of formula <chemical structure IX: phenyl—$R^{11}$—phenyl> where $R^{11}$ denotes a carbon-carbon bond, an ether oxygen atom, or a group of formula —CH$_2$— or —C(CH$_3$)$_2$—, (ii) a monocyclic or dicyclic arylene or aralkylene group of 6 to 16 carbon atoms, particularly a phenylene, a phenylenemethylene, (—C$_6$H$_4$CH$_2$—), a naphthylene group, or a group of formula <chemical structure X: phenylene—$R^{11}$—phenylene> where $R^{11}$ has the meaning assigned above, which aryl, aralkyl, arylene, or aralkylene groups may be substituted in the aromatic ring or rings by one to three chlorine, fluorine, or bromine atoms, or by one to three alkyl groups each of 1 to 4 carbon atoms, or by one to three alkoxy groups, each of 1 to 4 carbon atoms.

Specific examples of suitable groups Ar are phenyl, p-chlorophenyl, 3,4-dichlorophenyl, o-tolyl, p-tolyl, p-methoxyphenyl, 2,4-toluylene, 2,6-toluylene, benzyl, 2-phenylethyl, o-, m-, and p-phenylene, p-phenylenemethylene, and methylenebis(phenylene).

$R^7$ and $R^8$ are preferably each an alkyl group of 1 to 4 carbon atoms or a phenyl or a naphthyl group which may be substituted in the aromatic ring or rings by one or two alkyl groups, each of 1 to 4 carbon atoms, or by one or two alkoxy groups, each of 1 to 4 carbon atoms, or by one or two fluorine, chlorine, or bromine atoms. Most preferably they are each a methyl group.

$R^9$ and $R^{10}$ preferably each denote an aliphatic radical of 1 to 8 carbon atoms, especially an alkyl or alkenyl radical of 1 to 6 carbon atoms which may be substituted by from one to three chlorine, fluorine, or bromine atoms or interrupted in the chain by an ether oxygen atom.

Specific examples of suitable groups $R^9$ and $R^{10}$ are methyl, ethyl, and 2-ethoxyethyl groups.

$Z^{t-}$ may denote, for example, CH$_3$SO$_4^-$, but preferably it denotes Cl$^-$, Br$^-$, NO$_3^-$, HSO$_4^-$, HSO$_3^-$, ClO$_4^-$, CF$_3$SO$_3^-$, CF$_3$COO$^-$, C$_6$H$_5$SO$_3^-$, CH$_3$C$_6$H$_4$SO$_3^-$, H$_2$PO$_4^-$, SO$_4^{--}$, PO$_4^{---}$, or an anion of formula $$MX_n^- \qquad XI$$

where

M denotes an atom of a metal or of a metalloid,

X denotes a halogen atom, preferably of fluorine or of chlorine, and n is 4, 5, or 6, and is one more than the valency of M, or of formula $$SbF_5(OH)^-  \quad\quad XII$$

M preferably denotes an atom of boron or bismuth, and more especially antimony, arsenic, or phosphorus. The anion or anions $MX_n^-$, may thus be, for example, $BiCl_6^-$ or $BF_4^-$; but most preferably $MX_n^-$ represents $PF_6^-$, $SbF_6^-$, or $AsF_6^-$.

The sulphoxonium salts of formula VI may be prepared by the following procedures.

1. Those where p denotes zero and $R^6$ denotes a hydrogen atom may be obtained by reaction of an aromatic isocyanate of formula $$Ar(NCO)_q \quad\quad XIII$$

with q molar proportions of an oxosulphonium ylide of formula

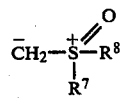

XIV to give a carbamoyl-containing ylide of formula

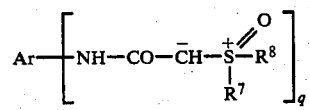

XV followed by neutralisation with q/t molar proportions of a protic acid of formula $H_tZ$, e.g., hydrochloric, phosphoric, tetrafluoroboric, hexafluorophosphoric, orthophosphoric, or nitric acid. Preferably an excess of the ylide of formula XIV is used with the isocyanate.

Oxosulphonium ylides of formula XIV are accessible from sulphoxonium iodides of formula

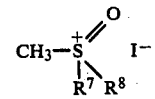

XVI by treatment with strong bases such as sodium hydride (E. J. Corey and M. Chaykovsky, *J. Amer. Chem. Soc.*, 1962, 84, 867). Reaction of such ylides with aryl and aralkyl isocyanates is described by H. König and H. Metzger, *Chem. Ber.*, 1965, 98, 3733–3747.

2. Sulphoxonium salts of formula VI where p denotes zero and $R^6$ denotes a group of formula VII may be obtained by reaction of an ylide of formula XV with an acylating agent to introduce a group of formula —$COR^9$, e.g., an acyl chloride, followed by neutralisation with q/t molar proportions of a protic acid of formula $H_tZ$.

Such acylation of carbamoyl-containing oxosulphonium ylides is described in U.S. Pat. No. 3,442,901.

3. Those where p denotes zero and $R^6$ denotes a group of formula VIII may be obtained by reaction of an ylide of formula XV with an equimolar proportion of an isocyanate of formula $R^{10}[(CO)_rNCO]_q$ to afford the bis(carbamoyl oxosulphonium ylide) of formula XVII

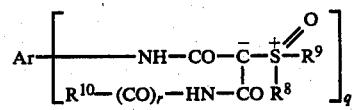

XVII followed by neutralisation with q/t molar proportions of a protic acid of formula $H_tZ$.

The further reaction of carbamoyl-containing ylides of formula XV with isocyanates is likewise described by König and Metzger, loc. cit.

4. Analogues of the above compounds where p denotes 1 and r denotes zero or 1 may be made in a similar manner from an aracyl isocyanate of formula $Ar(CONCO)_q$ and an isocyanate of formula $R^{10}[(CO)_rNCO]_q$. The reaction of acyl isocyanates with dimethyloxosulphonium methylide is described by O. Tsuge et al., *Tetrahedron*, 1973, 29, 1983–1990.

Where a particular protic acid of formula $H_tZ$ is not available, or is difficult to handle, salts such as hexafluorophosphates and hexafluoroantimonates may be made by double decomposition of the corresponding chlorides or other suitable salts. For example, acetanilinodimethylsulphoxonium hexafluorophosphate may be obtained by precipitation on adding an aqueous solution of potassium hexafluorophosphate to an aqueous solution of acetanilinodimethylsulphoxonium chloride. The corresponding hexafluoroantimonate may be made by addition of solid potassium hexafluoroantimonate to the aqueous solution of the chloride: if the potassium hexafluoroantimonate is first dissolved in water then, due to hydrolysis, the product isolated is the hydroxopentafluoroantimonate ($Z^{t-} = SbF_5(OH)^-$).

Specific examples of suitable carbamoylsulphoxonium salts are:

acetanilinodimethylsulphoxonium hexafluorophosphate and the corresponding hexafluoroarsenate, 3,4-dichloroacetanilinodimethylsulphoxonium hexafluoroarsenate, p-methylacetanilinodimethylsulphoxonium hexafluorophosphate, p-methylacetanilinodimethylsulphoxonium chloride, benzoylcarbamoyldimethylsulphoxonium hexafluorophosphate, p-chloroacetanilinodimethylsulphoxonium hexafluorophosphate, 2,4-bis(dimethylsulphoxoniummethylcarbamoyl)toluene dihexafluorophosphate, and tris(acetanilinodimethylsulphoxonium) orthophosphate.

Salts of formula VI where $Z^{t-}$ denotes an anion of formula XI or XII are believed to be new.

The compositions of this invention preferably contain 0.1 to 7.5, and particularly 0.5 to 5.0, parts by weight of (b) per 100 parts by weight of (a).

Component (a) may be, for example, an oxetane, a tetrahydrofuran, or a thi-irane, but preferably it is a 1,2-epoxide, a vinyl monomer or prepolymer, an aminoplast, or a phenoplast.

When (a) is a 1,2-epoxide, $Z^{t-}$ in formula VI must represent a group of formula $MX_n^-$ as aforesaid or a group of formula $SbF_5OH^-$. Component (a) may be, for example, a mono-1,2-epoxide, such as epichlorohydrin, propylene oxide, or a glycidyl ether of a monohydric alcohol or phenol, such as n-butyl glycidyl ether or phenyl glycidyl ether; it may also be, e.g., a glycidyl ester such as glycidyl acrylate or glycidyl methacrylate.

Preferably it is an epoxide resin, especially a resin containing at least one group of formula

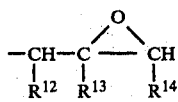　　　　XVIII directly attached to an atom of oxygen, where either $R^{12}$ and $R^{14}$ each represent a hydrogen atom, in which case $R^{13}$ denotes a hydrogen atom or a methyl group, or $R^{12}$ and $R^{14}$ together represent —CH$_2$CH$_2$—, in which case $R^{13}$ denotes a hydrogen atom.

As examples of such resins may be mentioned polyglycidyl and poly($\beta$-methylglycidyl) esters obtainable by reaction of a compound containing two or more carboxylic acid groups per molecule with epichlorohydrin, glycerol dichlorohydrin, or $\beta$-methylepichlorohydrin in the presence of an alkali. Such polyglycidyl esters may be derived from aliphatic polycarboxylic acids, e.g., succinic acid, glutaric acid, adipic acid, pimelic acid, suberic acid, azelaic acid, sebacic acid, or dimerised or trimerised linoleic acid; from cycloaliphatic polycarboxylic acids such as tetrahydrophthalic acid, 4-methyltetrahydrophthalic acid, hexahydrophthalic acid, and 4-methylhexahydrophthalic acid; and from aromatic polycarboxylic acids such as phthalic acid, isophthalic acid, and terephthalic acid. Other suitable polyglycidyl esters are obtainable by polymerisation of glycidyl esters of vinylic acids, especially glycidyl acrylate and glycidyl methacrylate.

Further examples are polyglycidyl and poly($\beta$-methylglycidyl) ethers obtainable by reaction of a compound containing at least two free alcoholic hydroxyl and/or phenolic hydroxyl groups per molecule with the appropriate epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene) glycols, propane-1,2-diol and poly(oxypropylene)glycols, propane-1,3-diol, poly(oxytetramethylene)glycols, pentane-1,5-diol, hexane-2,4,6-triol, glycerol, 1,1,1-trimethylolpropane, pentaerythritol, sorbitol, and poly(epichlorohydrin); from cycloaliphatic alcohols such as resorcitol, quinitol, bis(4-hydroxycyclohexyl)methane, 2,2-bis(4-hydroxycyclohexyl)propane, and 1,1-bis(hydroxymethyl)cyclohex-3-ene; and from alcohols having aromatic nuclei, such as N,N-bis(2-hydroxyethyl)aniline and p,p'-bis(2-hydroxyethylamino)diphenylmethane. Or they may be made from mononuclear phenols, such as resorcinol and hydroquinone, and from polynuclear phenols, such as bis(4-hydroxyphenyl)methane (otherwise known as bisphenol F), 4,4'-dihydroxydiphenyl, bis(4-hydroxyphenyl)sulphone, 1,1,2,2-tetrakis(4-hydroxyphenyl)ethane, 2,2-bis(4-hydroxyphenyl)propane, (otherwise known as bisphenol A), 2,2-bis(3,5-dibromo-4-hydroxyphenyl)propane, and novolaks formed from aldehydes such as formaldehyde, acetaldehyde, chloral, and furfuraldehyde, with phenol itself, and phenol substituted in the ring by chlorine atoms or by alkyl groups each containing up to nine carbon atoms, such as 4-chlorophenol, 2-methylphenol, and 4-tert.-butylphenol.

Poly(N-glycidyl) compounds may also be used, e.g., N-glycidyl derivatives of amines such as aniline, n-butylamine, bis(4-aminophenyl)methane, and bis(4-methylaminophenyl)methane; triglycidyl isocyanurate; and N,N'-diglycidyl derivatives of cyclic alkylene ureas, such as ethyleneurea and 1,3-propyleneurea, and of hydantoins such as 5,5'-dimethylhydantoin. In general, however, they are not preferred.

Poly(S-glycidyl) compounds may also be used, e.g., di(S-glycidyl) derivatives of dithiols such as ethane-1,2-dithiol and bis(4-mercaptomethylphenyl)ether, but they also are not preferred.

Examples of epoxide resins having groups of formula XVIII where $R^{12}$ and $R^{14}$ conjointly denote a —CH$_2$CH$_2$— group are bis(2,3-epoxycyclopentyl)ether, 2,3-epoxycyclopentyl glycidyl ether, and 1,2-bis(2,3-epoxycyclopentyloxy)ethane.

Epoxide resins having the 1,2-epoxide groups attached to different kinds of hetero atoms may be employed, e.g., the glycidyl ether-glycidyl ester of salicylic acid.

Epoxide resins in which some or all of the epoxide groups are not terminal may also be employed, such as vinylcyclohexene dioxide, limonene dioxide, dicyclopentadiene dioxide, 4-oxatetracyclo[6.2.1.0$^{2,7}$.0$^{3,5}$]undec-9-yl glycidyl ether, 1,2-bis(4-oxatetracyclo[6.2.1.0$^{2,7}$.0$^{3,5}$]undec-9-yloxy)ethane, 3,4-epoxycyclohexylmethyl 3',4'-epoxycyclohexanecarboxylate and its 6,6'-dimethyl derivative, ethylene glycol bis(3,4-epoxycyclohexanecarboxylate), 3-(3,4-epoxycyclohexyl)-8,9-epoxy-2,4-dioxaspiro[5,5]undecane, and epoxidised butadienes or copolymers of butadiene with ethylenic compounds such as styrene and vinyl acetate.

If desired, a mixture of epoxide resins may be used.

Especially preferred epoxide resins used in this invention are diglycidyl ethers, which may have been advanced, of dihydric phenols such as 2,2-bis(4-hydroxyphenyl)propane and bis(4-hydroxyphenyl)methane and of dihydric aliphatic alcohols such as butane-1,4-diol.

If desired, the epoxide resin may be co-cured with a polyhydric alcohol, i.e., a compound having at least two alcoholic hydroxyl, preferably primary, groups per molecule. Preferably the polyhydric alcohol is present in a quantity sufficient to supply from 0.5 to 1.5, especially 0.75 to 1.25, alcoholic hydroxyl groups per 1,2-epoxide group of the epoxide resin. The polyhydric alcohol preferably contains, in addition to the alcoholic hydroxyl groups, only carbon, hydrogen, and, optionally, oxygen present as ether oxygen, acetal or carbonyl groups, and halogen atoms. It is further preferred that the polyhydric alcohol have a molecular weight of at least 100 and particularly more than 1000. Examples of suitable polyhydric alcohols are poly(oxyethylene)-glycols, poly(oxypropylene)glycols, poly(oxytetramethylene)glycols, polyepichlorohydrins, poly(oxyethylene)-, poly(oxypropylene)-, and poly(oxytetramethylene)triols, obtainable by polymerisation of ethylene oxide, propylene oxide, or tetrahydrofuran in the presence of glycerol or 1,1,1-trimethylolpropane, hydroxyl-terminated polycaprolactones, copolymers of styrene with allyl alcohol, polyvinyl alcohols, hydroxypropylcellulose, hydroxyl-containing polyvinyl acetals, and partial esters of cellulose, e.g., a cellulose acetate butyrate.

Vinyl monomers and prepolymers which may be polymerised include styrene, $\alpha$-methylstyrene, allylbenzene, divinylbenzene, vinylcyclohexane, 4-vinylcyclohex-1-ene, N-vinylpyrrolidin-2-one, N-vinylcarbazole, acrolein, isoprene, butadiene, piperylene, vinyl acetate, and vinyl ethers such as isobutyl vinyl ether, methyl vinyl ether, trimethylolpropane trivinyl ether, glycerol trivinyl ether, vinyl ethers of ethylene glycol and poly(oxyethylene glycols), and cyclic vinyl ethers having at least two cyclic vinyl ether groups each forming part of a 3,4-dihydro-2H-pyran nucleus, such as 3,4-dihydro-2H-pyran-2-ylmethyl 3,4-dihydro-2H-pyran-2-carboxylate and its prepolymers. The preferred vinyl compounds are vinyl ethers of aliphatic monohydric alcohols having 1 to 4 carbon atoms, and 3,4-dihydro-2H-pyran-2-ylmethyl 3,4-dihydro-2H-pyran-2-carboxylate and its prepolymers.

The aminoplasts preferred as component (a) contain, per molecule, at least two groups of formula —CH$_2$OR$^{15}$ directly attached to an amidic or thioamidic nitrogen atom or atoms, where R$^{15}$ denotes a hydrogen atom, an alkyl group of 1 to 4 carbon atoms, or an acetyl group. Examples of such aminoplasts are the N-hydroxymethyl, N-methoxymethyl, N-butoxymethyl, and N-acetoxymethyl derivatives of the following amides and amide-like, substances.

I. Urea, thiourea, and the cyclic ureas having the formula

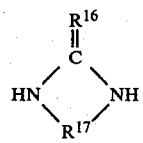

XIX in which
R$^{16}$ denotes oxygen or sulphur and
R$^{17}$ denotes either a group of formula

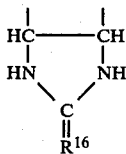

XX or a divalent group of 2 to 4 carbon atoms which may be substituted by methyl, methoxy, or hydroxy groups, and which may be interrupted by —CO—, —O—, or —N(R$^{17}$)—, where R$^{17}$ denotes an alkyl or hydroxyalkyl group containing up to 4 carbon atoms.

Examples of such cyclic ureas are ethyleneurea (imidazolidin-2-one), dihydroxyethyleneurea (4,5-dihydroxyimidazolidin-2-one), hydantoin, uron(tetrahydrooxadiazin-4-one), 1,2-propyleneurea(4-methylimidazolidin-2-one), 1,3-propyleneurea(hexahydro-2H-pyrimid-2-one), hydroxypropyleneurea(5-hydroxyhexahydro-2H-pyrimid-2-one), dimethylpropyleneurea(5,5-dimethylhexahydro-2H-pyrimid-2-one), dimethylhydroxypropyleneurea and dimethylmethoxypropyleneurea(4-hydroxy- and 4-methoxy-5,5-dimethylhexahydro-2H-pyrimid-2-one), 5-ethyltriazin-2-one, and 5-(2-hydroxyethyl)-triazin-2-one.

II. Carbamates and dicarbamates of aliphatic monohydric and dihydric alcohols containing up to four carbon atoms, e.g., methyl, ethyl, isopropyl, 2-hydroxyethyl, 2-methoxyethyl, 2-hydroxy-n-propyl and 3-hydroxy-n-propyl carbamates, and ethylene and 1,4-butylene dicarbamates.

III. Melamine and other polyamino-1,3-triazines such as acetoguanamine, benzoguanamine, and adipoguanamine.

If desired, aminoplasts containing both N-hydroxymethyl and N-alkoxymethyl, or N-hydroxymethyl and N-acetoxymethyl, groups may be used (for example, a hexamethylolmelamine in which 1 to 3 of the hydroxyl groups have been etherified with methyl groups).

The preferred aminoplasts are condensation products of urea, uron, hydantoin, or melamine with formaldehyde, and partially or fully etherified products of such condensation products with an aliphatic monohydric alcohol of 1 to 4 carbon atoms. Specific examples of suitable aminoplasts are hexamethoxymethylmelamine and a condensation product of urea with 1.8 mol. of formaldehyde.

The preferred phenoplasts are resols made from a phenol and an aldehyde. Suitable phenols include phenol itself, resorcinol, 2,2-bis(p-hydroxyphenyl)propane,, p-chlorophenol, a phenol substituted by one or two alkyl groups, each of 1 to 9 carbon atoms, such as o-, m-, and p-cresol, the xylenols, p-tertiary butylphenol, p-nonylphenol, and phenyl-substituted phenols, especially p-phenylphenol. The aldehyde which is condensed with the phenol is preferably formaldehyde, but other aldehydes such as acetaldehyde and furfuraldehyde may also be used. If desired, a mixture of such curable phenol-aldehyde resins may be used.

The preferred resols are condensation products of phenol, p-chlorophenol, resorcinol, or o-, m-, or p-cresol with formaldehyde.

Preferably the compositions of this invention also contain a sensitiser. We have found that, by incorporation of suitable sensitisers, the speed of curing is yet further increased, thereby permitting the use of even shorter exposure time and/or of less powerful sources of irradiation. Further, the sensitivity to visible light is enhanced. Sensitisers other than dyes have been found the more effective, particularly aromatic polycyclic compounds having at least three fused benzene rings and having an ionisation energy of less than about 7.5 ev. Suitable such sensitisers are described in U.S. Pat. No. 4,069,054, and include anthracene, rubrene, perylene, phenanthrene, fluoranthene, and pyrene.

We prefer to include from 0.1 to 2%, and especially from 0.25 to 0.75%, by weight of the sensitiser, calculated on the weight of (a).

In the photopolymerising step actinic radiation of wavelength from 200 to 600 nm is preferably used. Suitable sources of actinic radiation include carbon arcs, mercury vapour arcs, fluorescent lamps with phosphors emitting ultraviolet light, argon and xenon glow lamps, tungsten lamps, and photographic food lamps. Of these, mercury vapour arcs, particularly sun lamps, fluorescent sun lamps, and metal halide lamps are most suitable. The time required for the exposure will depend upon a variety of factors which include, for example, the individual polymerisable substrate used, the type of light source, and its distance from the irradiated material. Suitable times may be readily determined by those familiar with photopolymerisation techniques. If, as in the process described below, it is necessary that the product so photopolymerised must still be curable on heating with a heat-curing agent admixed therewith, then, of course, irradiation is carried out at a temperature below that at which substantial heat-curing of the photopolymerised product by means of the heat-curing agent would occur.

The compositions of this invention may be used as surface coatings. They may be applied to a substrate such as steel, aluminium, copper, cadmium, zinc, paper, or wood, preferably as a liquid, and irradiated. By polymerising part of the coating, as by irradiation through a mask, those sections which have not been exposed may be washed with a solvent to remove the unpolymerised portions while leaving the photopolymerised, insoluble portions in place. Thus the compositions of this invention may be used in the production of printing plates and printed circuits. Methods of producing printing plates and printed circuits from photopolymerisable compositions are well known (see, e.g., our British patent specification No. 1 495 746).

The compositions may also be used as adhesives. A layer of the composition may be sandwiched between two surfaces of objects, at least one of which is transparent to the actinic radiation, e.g., of glass, then the assembly is irradiated and, if desired, heated to complete the polymerisation.

The compositions are also useful in the production of fibre-reinforced composites, including sheet moulding compounds.

They may be applied directly, in liquid form, to reinforcing fibres (including strands, filaments, and whiskers), which may be in the form of woven or nonwoven cloth, unidirectional lengths, or chopped strands, especially glass, boron, stainless steel, tungsten, alumina, silicon carbide, asbestos, potassium titanate whiskers, an aromatic polyamide such as poly(m-phenylene isophthalamide), poly(p-phenylene terephthalamide), or poly(p-benzamide), polyethylene, polypropylene, or carbon.

The fibre-reinforced composite may be made by a batch process, the fibrous reinforcing material being laid on a film of the photopolymerised composition, which is advantageously under slight tension, when a second such film may, if desired, be laid on top, and the assembly is pressed while being heated. It may also be made continuously, such as by contacting the fibrous reinforcing material with a film of the photopolymerised composition, then, if desired, placing a second such film on the reverse face of the fibrous reinforcing material and applying heat and pressure. More conveniently, two such films, preferably supported on the reverse side by belts or strippable sheets, are applied simultaneously to the fibrous reinforcing material so as to contact each exposed face. When two such films are applied, they may be the same or different.

Multilayer composites may be made by heating under pressure interleaved films and layers of one or more fibrous reinforcing materials. When unidirectional fibres are used as the reinforcement material, successive layers of them may be oriented to form crossply structures.

With the fibrous reinforcing material there may be used additional types of reinforcement such as a foil of metal (e.g., aluminium, steel, or titanium) or a sheet of a plastics material (e.g., an aromatic or aliphatic polyamide, a polyimide, a polysulphone, or a polycarbonate) or of a rubber (e.g., a neoprene or acrylonitrile rubber).

In the production of sheet moulding compounds, a composition of this invention, together with the chopped strand reinforcing material and any other components, are exposed to irradiation in layers through supporting sheets.

The polymerisable composition is preferably applied so that the composite contains a total of from 20 to 80% by weight of the said composition and, correspondingly, 80 to 20% by weight of the reinforcement. More preferably, a total of 30 to 50% by weight of the composition is employed.

The compositions of this invention are useful in the production of putties and fillers. They may be used as dip-coatings, an article to be coated being dipped in the liquid composition, withdrawn, and the adhering coating being irradiated to photopolymerise, and hence solidify it, and subsequently, if desired, being heated.

We have found that it is possible, using the compositions of this invention, to cure epoxide resins and phenoplasts in two stages; the resin is first converted into the partially cured B-stage by exposing it to actinic radiation in the presence of a sulphoxonium salt and a latent, heat-activated crosslinking agent for the epoxide resin or phenoplast, and, in a second stage, the partially cured composition is heated so that curing it completed by means of the heat-activated crosslinking agent. Thus, a liquid or semiliquid composition may be prepared, which may then be shaped or used to impregnate a substrate while being irradiated to solidify it; then the solidified body is heated when desired, to complete the cure of the resin.

According, therefore, to another embodiment of this invention, an epoxide resin or a phenoplast is irradiated, in the presence of an amount of a sulphoxonium salt of formula VI effective for the polymerisation of the epoxide resin or phenoplast and of a curing amount of a latent heat-curing agent for the epoxide resin or phenoplast, to form a B-stage product, and, when desired, curing of the composition is completed by heating it.

A further embodiment comprises a composition containing an epoxide resin or phenoplast, an amount of a sulphoxonium salt of formula VI effective for polymerisation of the said epoxide resin or phenoplast on exposure of the composition to actinic radiation, and a curing amount of a latent heat-curing agent for the epoxide resin or phenoplast.

Suitable heat-activated crosslinking agents for the epoxide resin compositions include polycarboxylic acid anhydrides, complexes of amines, especially primary or tertiary aliphatic amines such as ethylamine, trimethylamine, and n-octyldimethylamine, with boron trifluoride or boron trichloride, and latent boron difluoride chelates. Aromatic polyamines and imidazoles are usually not preferred, because indifferent results are obtained, possibly due to reaction between the acid catalyst liberated and the amine. Dicyandiamide can be used successfully, providing it is in relatively coarse particles.

Suitable heat-activated crosslinking agents for resols include hexamethylenetetramine and paraform.

The temperature and duration of heating required for the thermal curing and the proportions of heat-activated curing agent are readily found by routine experimentation and easily derivable from what is already well known concerning the heat-curing of epoxide resins and phenol-aldehyde resols.

By virtue of the compositions having groups through which they can be heat-cured after photopolymerisation, they are particularly useful in the production of multilayer printed circuits.

Conventionally, a multilayer printed circuit is prepared from several double-sided printed circuit boards of copper, stacked one on top of another and separated from each other by insulating sheets, usually of glass fibre impregnated with an epoxide resin or a phenol-formaldehyde resin in the B-stage. If a heat-curing agent is not admixed with the layer of photopolymerisable resin in the circuit board, it can be incorporated in the insulating layers which alternate with the plates, these layers conveniently being of an epoxide resin or phenol-formaldehyde resin prepreg; sufficient of the heat-curing agent contained in the prepreg, providing the latter is not too thick, migrates to induce crosslinking of the photopolymerised epoxide resin or phenol-formaldehyde resin. The stack is heated and compressed to bond the layers together. Conventional photopolymerisable materials, however, do not form strong bonds either with copper or with resin-impregnated glass fibre sheets. A stack which is bonded with the photopolymer still covering the copper is therefore inherently weak and in use can become delaminated. It is therefore normal practice to remove the residual photopolymer after the etching stage, either by means of powerful solvents or by a mechanical method, e.g., by means of brushes. Such a stripping process can damage the copper of the printed circuit or the surface of the laminate on which the circuit rests, and so there is a need for a method which would avoid the necessity of removing the photopolymerised material prior to bonding the boards together. The presence of residual crosslinking groups in the compositions of this invention means that crosslinking can occur when the boards are bonded, resulting in good adhesion to the copper and to the resin-impregnated glass fibre substrate, so avoiding the necessity just referred to.

Another application involving heat-curing after photopolymerisation of the compositions of this invention is in filament winding. Thus, a continuous tow of fibrous reinforcement is impregnated with a composition containing a latent heat-curing agent and then wound around a mandrel or former while exposing the winding to actinic radiation. Such filament windings still have a degree of flexibility, permitting the mandrel or former to be removed more readily than when a rigid winding is formed in one step. When required, the winding is heated to crosslink the composition.

In a further such application, a layer of the composition in liquid form is irradiated until it solidifies, producing a film adhesive, which is then placed between, and in contact with, two surfaces which are to be bonded together, and the assembly is heated to complete crosslinking of the composition. The film may be provided on one face with a strippable backing sheet, e.g., of a polyolefin or a polyester, or of cellulosic paper having a coating of a silicone release agent. Manipulation of the assembly is often easier if the film has a tacky surface. This may be produced by coating the film with a substance which is tacky at room temperature but which crosslinks to a hard, insoluble, infusible, resin under the conditions of heat employed to complete crosslinking of the composition. However, an adequate degree of tackiness often exists without additional treatment, especially if polymerisation of the composition has not proceeded too far. Suitable adherends include metals such as iron, zinc, cadmium, copper, nickel, and aluminium, ceramics, glass, and rubbers.

The following Examples illustrate the invention. Unless otherwise indicated, parts are by weight. Flexural strengths are the mean of three results and were determined according to British Standard No. 2782, Method 304B.

Sulphoxonium salts employed in these Examples were prepared as follows.

Acetanilinodimethylsulphoxonium hexafluorophosphate

Dimethyl-N-phenylcarbamoyloxosulphonium ylide (10.5 parts), prepared as described by König and Metzger, *Chem. Ber.*, 1965, 98, 3740, was dissolved in 110 parts of 0.5 M hydrochloric acid. To this was added, with stirring, a solution of 9.5 parts of potassium hexafluorophosphate in water. The white solid which separated was filtered off, washed with water, and recrystallised from ethanol, to give 8 parts of the desired product (VI, $Ar=C_6H_5$, p=zero, $R^6=H$, $R^7=R^8=CH_3$, q=1, t=1, $Z^{t-}=PF_6^-$), m.pt. 141° C.–5° C.; NMR (acetone -$d_6$) 4.17 (s=6H), 5.41 (s-2H), 7.1–7.6 (m-5H), 9.90 (s-1H); IR (KBr disc) 3310, 3030, 3015, 3000, 2960, 2920, 2880, 1665, 1600, 1560, 1490, 1440, 1340, 1240, 1030, 960, 840, 760 cm$^{-1}$; UV (ethanol) $\lambda_{max}$ 269 nm.

3,4-Dichloroacetanilinodimethylsulphoxonium hexafluoroarsenate

Dimethyl-N-(3,4-dichlorophenyl)carbamoyloxosulphonium ylide (56 parts), prepared by the method described by König and Metzger, loc. cit., was stirred with 400 parts of 0.5 M hydrochloric acid, and a solution of 46 parts of potassium hexafluoroarsenate in 250 parts of water was added with stirring. After 30 minutes the solid was filtered off, washed with water, and recrystallised from ethanol. There was thereby obtained 27 parts of the desired product (VI, $Ar=3,4-Cl_2C_6H_3$, p=zero, $R^6=H$, $R^7=R^8=CH_3$, q=1, t=1, $Z^{t-}=AsF_6^-$), m.pt. 125°–9° C.; NMR (acetone -$d_6$) 4.22 (s-6H), 5.50 (s-2H), 7.50 (m-2H), 8.03 (m-1H), 10.50 (s-1H); IR (KBr disc) 3650, 3535, 3100, 3020, 2970, 2930, 2850, 1675, 1605, 1530, 1470, 1380, 1330, 1220, 1170, 1050, 710 cm$^{-1}$; UV (ethanol) $\lambda_{max}$ 275 nm.

p-Methylacetanilinodimethylsulphoxonium hexafluorophosphate

Dimethyl-N-(p-tolyl)carbamoyloxosulphonium ylide (22.5 parts) prepared by the method of König and Metzger, loc. cit., was stirred with 200 parts of 0.5 M hydrochloric acid and to this was added, with stirring, a solution of 19 parts of potassium hexafluorophosphate in water. The white solid which precipitated was filtered off, washed with water, and recrystallised from ethanol, affording 21 parts of the desired compound (VI, $Ar=p-CH_3C_6H_4$, p=zero, $R^6=H$, $R^7=R^8=CH_3$, q=1, t=1, $Z^{t-}=PF_6^-$), m.pt. 144°–7° C.; NMR (acetone -$d_6$) 2.30 (s-3H), 4.13 (s-6H), 5.37 (s-2H), 7.35 (m-4H), 9.88 (s-1H); IR (KBr disc) 3380, 3020, 3000, 2940, 2920, 1675, 1600, 1540, 1510, 1400, 1320, 1240, 1040, 840 cm$^{-1}$. UV (ethanol) $\lambda_{max}$ 269 nm.

p-Methylacetanilinodimethylsulphoxonium chloride

Dimethyl-N-(p-tolyl)carbamoyloxosulphonium ylide (22.5 parts), prepared by the method of König and Metzger, loc. cit., was stirred with 200 parts of 0.5 M hydrochloric acid, then the mixture was filtered, and the water was evaporated off from the filtrate. The residue after evaporation was washed with toluene and dried, to yield 7 parts of the desired product (VI, $Ar=p-CH_3C_6H_4$, p=zero, $R^6=H$, $R^7=R^8=CH_3$, q=1, t=1, $Z^{t-}=Cl^-$).

Benzoylcarbamoyldimethylsulphoxonium hexafluorophosphate

Dimethylsulphoxonium benzoylcarbamoyl methylide, prepared as described by Tsuge et al., Tetrahedron, 1973, 29, 1983, (4.8 parts) was stirred with 50 parts of 0.5 M hydrochloric acid, and then a solution of 3.7 parts of potassium hexafluorophosphate in water was added. The white solid was filtered off, washed with water, and dried under vacuum to give 7 parts of the desired product (VI, Ar=$C_6H_5$, p=1, $R^6$=H, $R^7$=$R^8$=$CH_3$, q=1, t=1, $Z^{t-}$=$PF_6^-$). NMR (acetone -$d_6$) 4.19 (s-6H), 6.02 (s-2H), 7.5–8.2 (m-5H), 9.95 (s-1H); IR(KBr disc) 3320, 1710, 1680, 1460, 1360, 1320, 1240, 1170, 1040, 840, 710 cm$^{-1}$; UV (ethanol) $\lambda_{max}$ 274 nm.

2,4-Bis(dimethylsulphoxoniummethylcarbamoyl)toluene dihexafluorophosphate

The bis(dimethyloxosulphurylene ylide) (3.6 parts), prepared by the reaction of toluene-2,4-di-isocyanate with 2 molar proportions of dimethylsulphoxonium methylide following the method of König and Metzger, loc. cit., was stirred with 40 parts of 0.5 M hydrochloric acid. Potassium hexafluorophosphate (3.7 parts) dissolved in water was added and the mixture was stirred for 15 minutes. The solid was filtered off, washed with water, and dried under vacuum; 5 parts of the desired product (VI, Ar denotes

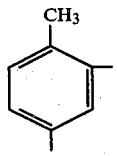

XXI p=zero, $R^6$=H, $R^7$=$R^8$=$CH_3$, q=2, t=1, $Z^{t-}$=$PF_6^-$) were obtained.

p-Chloroacetanilinodimethylsulphoxonium hexafluorophosphate

Dimethyl-N-(p-chlorophenyl)carbamoyloxosulphonium ylide (49 parts), prepared by the method of König and Metzger, loc. cit., was stirred in 400 parts of 0.5 M hydrochloric acid, and thereto was added while stirring a solution of 37 parts of potassium hexafluorophosphate in water. After 30 minutes the precipitate was filtered off, washed with water, and dried: 60 parts were obtained of the desired product (VI, Ar=p-Cl$C_6H_4$, p=zero, $R^6$=H, $R^7$=$R^8$=$CH_3$, q=1, t=1, $Z^{t-}$=$PF_6^-$), m.pt. 161°-3° C.; NMR (acetone -$d_6$) 4.17 (s-6H), 5.43 (s-2H), 7.3–7.8 (m=4H), 10.05 (s-1H); IR (KBr disc) 3260, 3040, 2980, 2930, 1660, 1540, 1490, 1400, 1320, 1240, 1090, 1040, 840 cm$^{-1}$; UV (ethanol) $\lambda_{max}$ 273 nm.

Tris(acetanilinodimethylsulphoxonium) orthophosphate

Dimethyl-N-phenylcarbamoyloxosulphonium ylide (5 parts), prepared as described by König and Metzger, was added to orthophosphoric acid (0.78 part) in water (100 parts). After the mixture had been stirred for 2 hours undissolved solid was filtered off and the filtrate was concentrated under reduced pressure. The desired product, after drying under vacuum, weighed 5.3 parts (VI, Ar=$C_6H_5$, p=zero, $R^6$=H, $R^7$=$R^8$=$CH_3$, q=1, t=3, $Z^{t-}$=$PO_4^{---}$).

Acetanilinodimethylsulphoxonium hexafluoroarsenate

Dimethyl-N-phenylcarbamoyloxosulphonium ylide (6.3 parts) was dissolved in 30 parts of 1.0 M hydrochloric acid. To this was added, with stirring, a solution of 6.8 parts of potassium hexafluoroarsenate in water. The white solid which separated was filtered off, washed with water, and recrystallised from methanol, to give 8 parts of the desired product (VI, Ar=$C_6H_5$, p=zero, $R^6$=H, $R^7$=$R^8$=$CH_3$, q=1, $Z^{t-}$=$AsF_6^-$), m.pt. 146°-7° C.; NMR (acetone -$d_6$) 4.17 (s-6H), 5.41 (s=2H), 7.1–7.6 (m-5H), 9.90 (s-1H); IR (KBr disc) 3310, 3030, 3015, 3000, 2960, 2920, 2880, 1665, 1600, 1560, 1490, 1440, 1340, 1240, 1030, 760, 705 cm$^{-1}$; UV (ethanol) $\lambda_{max}$ 269 nm.

EXAMPLES 1–7

Compositions of epoxide resins (98 parts) and carbamoylsulphoxonium salts (2 parts) were prepared as listed in the following Table and drawn as films 10 μm thick on tinplate, then subjected at a distance of 8 cm to radiation from a medium pressure mercury arc lamp (80 w per cm) for the indicated time. In each case a tack-free coating was formed.

| Example No. | Epoxide Resin | Carbamoylsulphoxonium salt | Irradiation time (secs.) |
|---|---|---|---|
| 1 | 2,2-Bis(p-glycidyloxyphenyl)propane | Acetanilinodimethylsulphoxonium hexafluorophosphate | 30 |
| 2 | 2,2-Bis(p-glycidyloxyphenyl)propane | Acetanilinodimethylsulphoxonium hexafluoroarsenate | 30 |
| 3 | 2,2-Bis(p-glycidyloxyphenyl)propane | 3,4-Dichloroacetanilinodimethylsulphoxonium hexafluoroarsenate | 20 |
| 4 | 2,2-Bis(p-glycidyloxyphenyl)propane | p-Methylacetanilinodimethylsulphoxonium hexafluorophosphate | 15 |
| 5 | 2,2-Bis(p-glycidyloxyphenyl)propane | Benzoylcarbamoyldimethylsulphoxonium hexafluorophosphate | 30 |
| 6 | 2,2-Bis(p-glycidyloxyphenyl)propane | 2,4-Bis(dimethylsulphoxoniummethylcarbamyl)toluene dihexafluorophosphate | 60 |
| 7 | 3,4-Epoxycyclohexylmethyl 3,4-epoxycyclohexanecarboxylate | 3,4-Dichloroacetanilinodimethylsulphoxonium hexafluoroarsenate | 10 |

EXAMPLE 8

The procedure of Examples 1–7 was repeated, employing a composition consisting of 4 parts of p-chloroacetanilinodimethylsulphoxonium hexafluorophosphate and 96 parts of 2,2-bis(p-glycidyloxyphenyl)propane. A tack-free coating was formed within 10 seconds.

EXAMPLE 9

A mixture of 2 parts of 3,4-dichloroacetanilinodimethylsulphoxonium hexafluoroarsenate and 98 parts of 3,4-dihydro-2H-pyran-2-methyl 3,4-dihydro-2H-pyran-2-carboxylate was irradiated as a film 10 μm thick on tinplate for 20 seconds as described in Examples 1–7. A tack-free coating was produced.

EXAMPLE 10

The procedure of Example 9 was repeated, using in place of the vinyl ether a commercially-available phenol-formaldehyde resol having a P:F molar ratio of 1:1.6 and, as catalyst, p-methylacetanilinodimethylsulphoxonium chloride. A hard, tack-free, solvent-resistant coating was obtained after irradiation for 5 seconds.

EXAMPLE 11

The procedure of Example 9 was repeated, but using in place the vinyl ether a commercially-available urea-formaldehyde resin (resin-forming solids content 70%, U:F molar ratio of 1:1.8). A tack-free, solvent-resistant coating was obtained on irradiation for 5 seconds.

EXAMPLE 12

A mixture of 100 parts of the urea-formaldehyde resin used in Example 9 and 2 parts of tris(acetanilinodimethylsulphoxonium) orthophosphate was exposed, in the form of a film 10 μm thick, on tinplate under the conditions described in Examples 1 to 7. After 5 seconds exposure a tack-free coating was obtained.

EXAMPLE 13

This Example illustrates the use of a sensitiser.

A further portion of the composition described in Example 4 was applied as a layer 10 μm thick on tinplate and exposed at a distance of 22 cm to a 400 w high pressure metal halide quartz lamp. This lamp was deliberately chosen as an inefficient source of photopolymerisation energy for this particular catalyst, the radiation being predominantly in the 360 mm band. After exposure for 15 minutes the layer was not completely tack-free.

Next, to a fresh portion of the composition was added 0.5% by weight of pyrene, and a film of this mixture was exposed in a similar manner. The film became tack-free within 8 minutes.

EXAMPLE 14

This Example demonstrates a two-stage process, in which an epoxide resin composition is first photopolymerised and then, on heating, is crosslinked by means of the latent heat-curing catalyst also contained in the composition.

Glasscloth was impregnated with a liquid composition comprising 75 parts of 2,2-bis(p-glycidyloxyphenyl)propane (epoxide content 5.2 equiv./kg), 25 parts of a polyglycidyl ether of a phenol-formaldehyde novolac (epoxide content 5.6 equiv./kg), 4 parts of boron trichloride-trimethylamine complex (a heat-activated crosslinking agent for epoxide resins), and 2 parts of 3,4-dichloroacetanilinodimethylsulphoxonium hexafluoroarsenate. Both sides of the impregnated glasscloth were irradiated at a distance of 8 cm. from a medium pressure mercury arc lamp (80 w per cm) for 60 seconds so as to solidify the composition. A six-ply laminate was made by pressing 10 cm.-square pieces of the prepreg at 200° C. for 1 hour under a pressure of 1.05 MN/m². The laminate, which contained 64% of glass, had a flexural strength of 380 MN/m².

EXAMPLE 15

This Example illustrates co-curing of an epoxide resin with a polyhydric alcohol.

A composition consisting of 20 parts of 3,4-epoxycyclohexylmethyl 3,4-epoxycyclohexanecarboxylate, 10 parts of a commercially-available styrene-allyl alcohol copolymer (hydroxy content 3.56 equiv./kg), and 1.2 parts of p-chloroacetanilinodimethylsulphoxonium hexafluorophosphate was applied as a coating 10 μm thick on tinplate and then exposed to irradiation from a medium pressure mercury arc lamp. After 30 seconds exposure a tack-free film was produced.

EXAMPLE 16

This Example illustrates the production of a photoresist.

A solution in 10 g cyclohexanone was prepared, containing 1 g of 2,2-bis(p-glycidyloxyphenyl)propane, 4 g of the tetraglycidyl ether of 1,1,2,2-tetra(p-hydroxyphenyl)ethane, 5 g of a diglycidyl ether of 2,2-bis(p-hydroxyphenyl)propane which diglycidyl ether had been advanced with a bromine-containing phenol to a softening point of about 50° C. and an epoxide content of 2 equiv./kg, and 0.4 g of p-chloroacetanilinodimethylsulphoxonium hexafluorophosphate. A copper-clad laminate was coated with this composition and the solvent was allowed to evaporate, leaving a film about 10 μm thick. This film was irradiated for 60 minutes through a negative using a 500 w medium pressure mercury lamp at a distance of 22 cm. After irradiation the image was developed in toluene, washing away the unexposed areas to leave a good relief image on the copper.

What is claimed is:

1. A cationically photopolymerizable composition comprising
   (a) a compound, or mixture of compounds, capable of being transformed into a higher-molecular weight material under the influence of a cationic catalyst, which is a 1,2-epoxide, a vinyl monomer or prepolymer, an aminoplast, a phenoplast, an oxetane, tetrahydrofuran or a thi-irane, and
   (b) an effective amount of a carbamoylsulfoxonium salt of the formula

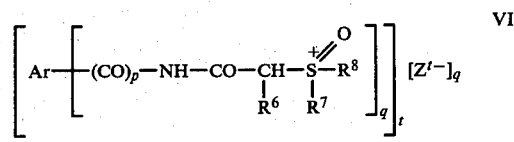

where
p is zero or 1,
q is an integer of from 1 to 4,
Ar denotes an aromatic group of valency q, having from 4 to 25 carbon atoms and being directly linked through a carbon atom thereof to the carbon atom of the indicated adjacent carbonyl group if p is 1 or to the indicated nitrogen atom if p is zero,
$R^6$ denotes a hydrogen atom or a group of formula $$-COR^9 \qquad \qquad \text{VII}$$

or $$-CONH(CO)_r-R^{10} \qquad \text{VIII}$$

$R^7$ denotes an alkyl group of 1 to 18 carbon atoms, an alkenyl group of 2 to 6 carbon atoms, a cycloalkyl group of 3 to 8 carbon atoms, a cycloalkylalkyl group of 4 to 10 carbon atoms, an aryl group of 4 to 24 carbon atoms, or an aralkyl group of 5 to 16 carbon atoms, $R^8$ has the same meaning as $R^7$, but may independently represent a dialkylamino group of 2 to 6 carbon atoms or, if $R^7$ denotes a said alkyl group, it may independently represent an arylamino group of 4 to 8 carbon atoms, $R^9$ denotes a monovalent saturated or ethylenically unsaturated radical of 1 to 12 carbon atoms, directly linked through a carbon atom thereof to the —CO— group shown in formula VII, r is zero or 1, $R^{10}$ denotes a monovalent saturated or ethylenically unsaturated radical of 1 to 12 carbon atoms, directly linked through a carbon atom thereof to, if r denotes zero, the indicated nitrogen atom, or, if r denotes 1, the carbon atom of the indicated adjacent carbonyl group, t represents 1, 2, or 3, and $Z^{t-}$ denotes a t-valent anion which is $Cl^-$, $Br^-$, $NO_3^-$, $HSO_4^-$, $HSO_3^-$, $ClO_4^-$, $CF_3SO_3^-$, $CF_3COO^-$, $C_6H_5SO_3^-$, $CH_3C_6H_4SO_3^-$, $H_2PO_4^-$, $SO_4^{--}$, $PO_4^{---}$, $SbF_5(OH)^-$, $CH_3SO_4^-$ or an anion of formula $$MX_n^- \qquad \qquad XI$$

where

M denotes an atom of a metal or of a metalloid,

X denotes a halogen atom, and n is 4, 5, or 6 and is one more than the valency of M.

2. A composition according to claim 1, in which Ar represents a monocyclic or dicyclic aryl or aralkyl group of 6 to 16 carbon atoms.

3. A composition according to claim 1, in which Ar represents a monocyclic or dicyclic arylene or aralkylene group of 6 to 16 carbon atoms.

4. A composition according to claim 1, in which $R^7$ and $R^8$ each denote an alkyl group of 1 to 12 carbon atoms, or a phenyl or naphthyl group which may be substituted in the aromatic ring or rings by one or two alkyl groups, each of 1 to 4 carbon atoms, or by one or two alkoxy groups, each of 1 to 4 carbon atoms, or by one or two fluorine, chlorine, or bromine atoms.

5. A composition according to claim 1, in which $R^9$ denotes an aliphatic radical of 1 to 8 carbon atoms.

6. A composition according to claim 1, in which $R^{10}$ denotes an aliphatic radical of 1 to 8 carbon atoms.

7. A composition according to claim 1, where $Z^{t-}$ denotes $Cl^-$, $Br^-$, $NO_3^-$, $HSO_4^-$, $HSO_3^-$, $ClO_4^-$, $CF_3SO_3^-$, $CF_3COO^-$, $C_6H_5SO_3^-$, $CH_3C_6H_4SO_3^-$, $H_2PO_4^-$, $SO_4^{--}$, $PO_4^{---}$, $SbF_5(OH)^-$, or an anion of formula $$MX_n^- \qquad \qquad XI$$

where

M denotes an atom of antimony, bismuth, boron, arsenic, or phosphorus,

X denotes an atom of fluorine or chlorine, and n is 4, 5, or 6 and is one more than the valency of M.

8. A composition according to claim 1, in which (b) is acetanilinodimethylsulfoxonium hexafluorophosphate, acetanilinodimethylsulfoxonium hexafluoroarsenate, 3,4-dichloroacetanilinodimethylsulfoxonium hexafluoroarsenate, p-methylacetanilinodimethylsulfoxonium hexafluorophosphate, benzoylcarbamoyldimethylsulfoxonium hexafluorophosphate, 2,4-bis(dimethylsulfoxonium methylcarbamoyl)toluene dihexafluorophosphate, p-chloroacetanilinodimethylsulfoxonium hexafluorophosphate, p-methylacetanilinodimethylsulfoxonium chloride, or tris(acetanilinodimethylsulfoxonium) orthophosphate.

9. A composition according to claim 1, wherein (a) is a 1,2-epoxide, a vinyl monomer or prepolymer, an aminoplast, or a phenoplast.

10. A composition according to claim 9, wherein (a) is a resol resin made from a phenol and an aldehyde or is an epoxide resin.

11. A composition according to claim 1, containing 0.1 to 7.5 parts by weight of (b) per 100 parts by weight of (a).

12. A composition according to claim 10, which also contains a curing amount of a latent heat-curing agent for the resol resin or for the epoxide resin.

* * * * *